(12) United States Patent
Moyal (10) Patent No.: US 6,329,840 B1
(45) Date of Patent: Dec. 11, 2001

(54) TRISTATE OUTPUT BUFFER WITH MATCHED SIGNALS TO PMOS AND NMOS OUTPUT TRANSISTORS

(75) Inventor: Nathan Y. Moyal, Austin, TX (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 09/458,552

(22) Filed: Dec. 9, 1999

(51) Int. Cl.[7] ............................ H03K 19/00; H03K 19/02
(52) U.S. Cl. ................................. 326/58; 326/83; 326/57
(58) Field of Search ................................. 326/57, 58, 83, 326/85, 27

(56) References Cited

U.S. PATENT DOCUMENTS 5,812,461 * 9/1998 Komarek et al. ............... 365/189.05
5,883,527 * 3/1999 Saito ..................................... 326/58
5,986,473 * 11/1999 Krishnamurthy et al. ............. 326/83

FOREIGN PATENT DOCUMENTS

401189224-A * 7/1989 (JP) ........................................ 326/58

* cited by examiner

*Primary Examiner*—Michael Tokar
*Assistant Examiner*—Daniel D. Chang
(74) *Attorney, Agent, or Firm*—Christopher P. Maiorana, P.C.

(57) ABSTRACT

A circuit comprising a first and a second circuit. The first circuit may be configured to generate a first control signal and a second control signal in response to (i) a first input signal and (ii) an enable signal. The first control signal generally matches the second control signal. The second circuit may be configured to generate a third control signal and a fourth control signal in response to (i) a second input signal and (ii) the enable signal. The third control signal generally matches the fourth control signal.

16 Claims, 10 Drawing Sheets

FIG. 1
(CONVENTIONAL)

FIG. 2
(CONVENTIONAL)

FIG. 4a
(CONVENTIONAL)

FIG. 4b
(CONVENTIONAL)

TRISTATE OUTPUT BUFFER WITH MATCHED SIGNALS TO PMOS AND NMOS OUTPUT TRANSISTORS

FIELD OF THE INVENTION

The present invention relates to output buffers generally and, more particularly, to a method and apparatus for implementing a tristate output buffer with matched signals to PMOS and NMOS output transistors.

BACKGROUND OF THE INVENTION

When designing an output buffer, it is important to make sure that the output transistors of the buffer do not turn on at the same time. If the output transistors are on at the same time, a "rush through" current (i.e., a large amount of current pulled directly from Vcc to ground) will produce a high magnitude of noise. To avoid the "rush through" current problem, the timing of the output transistors switching must be matched to ensure that the transistors are not both in saturation at the same time.

Figure 1:
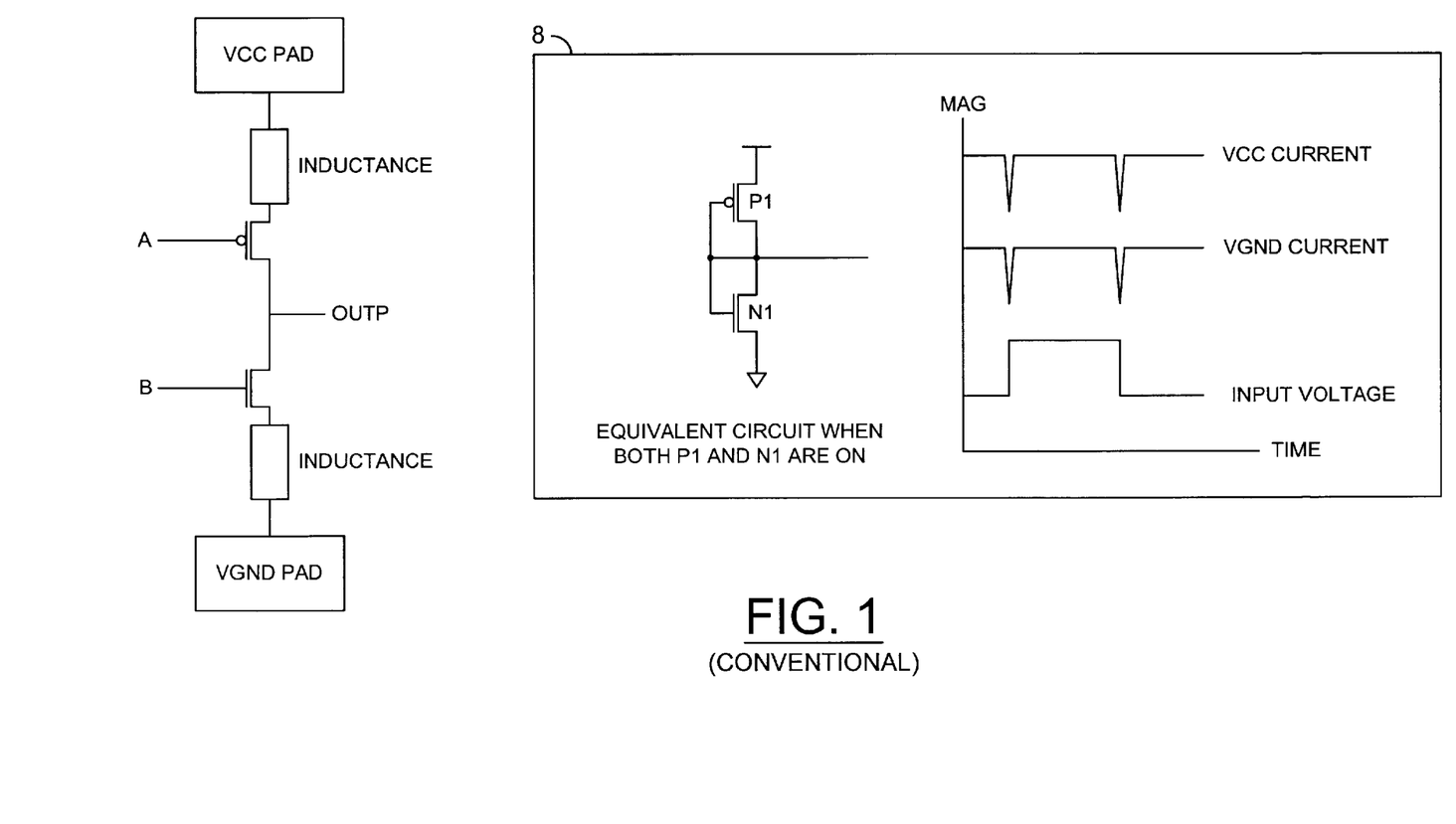
FIG. 1 is a timing diagram of a conventional buffer.

Referring to FIG. 1, a diagram of a conventional approach illustrating the effects of a PMOS output transistor and an NMOS output transistor turning on at the same time is shown. If the signals A and B are not matched, the output transistors can both be on at the same time. An equivalent circuit illustrating both transistors conducting and the resulting "rush-through" currents is shown in a box 8.

Figure 2:
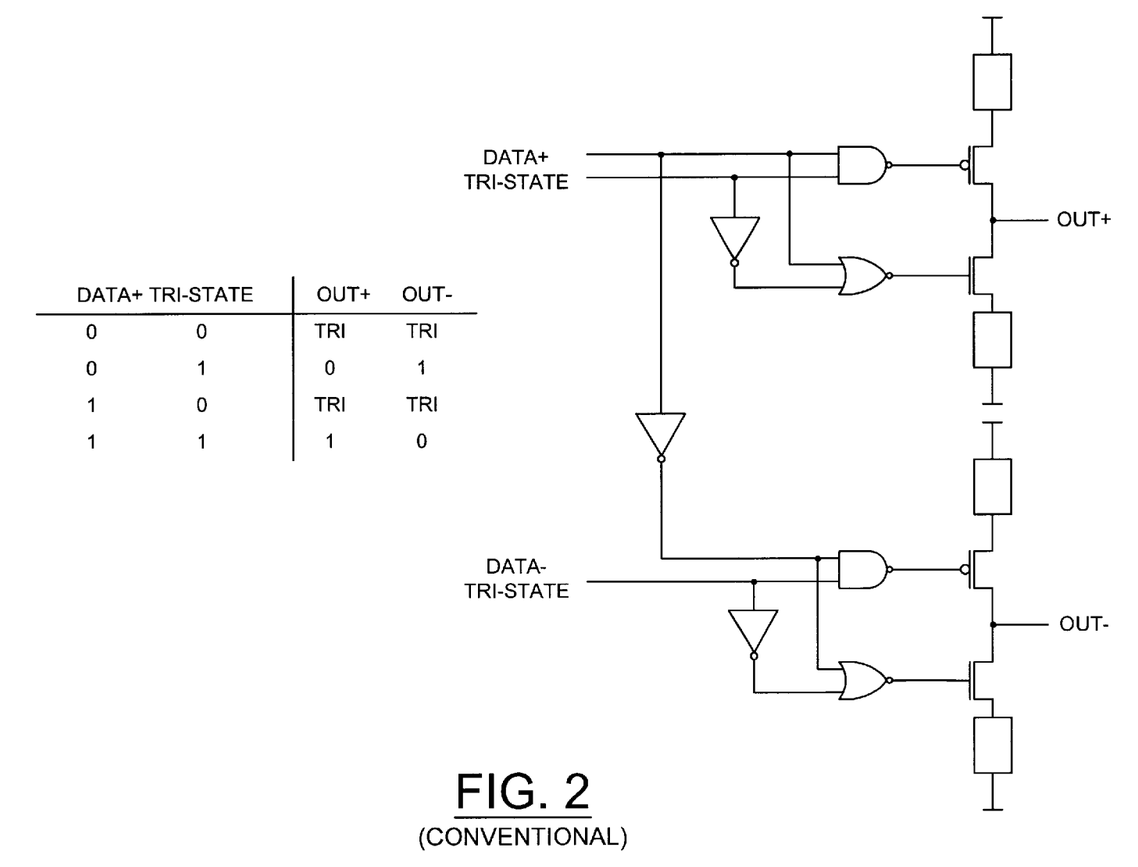
FIG. 2 is a circuit diagram of a conventional tristate output buffer.

Referring to FIG. 2, a circuit diagram illustrating a conventional tristate output buffer 10 is shown. The output buffer 10 uses two different logic gates to generate control signals for switching the output transistors. However, matching the delay path of two different logic gates (i.e., a NAND and a NOR) is difficult.

Figure 3A:
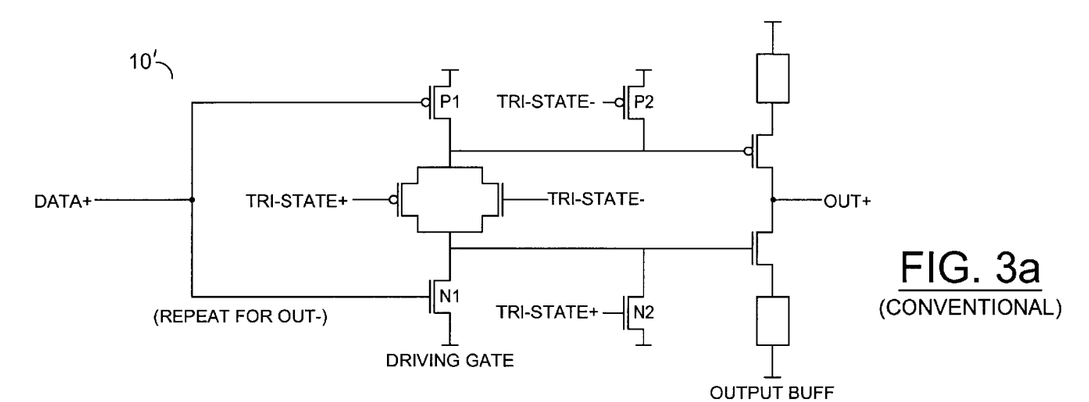
FIG. 3a is a circuit diagram of another conventional tristate output buffer.
Figure 3B:
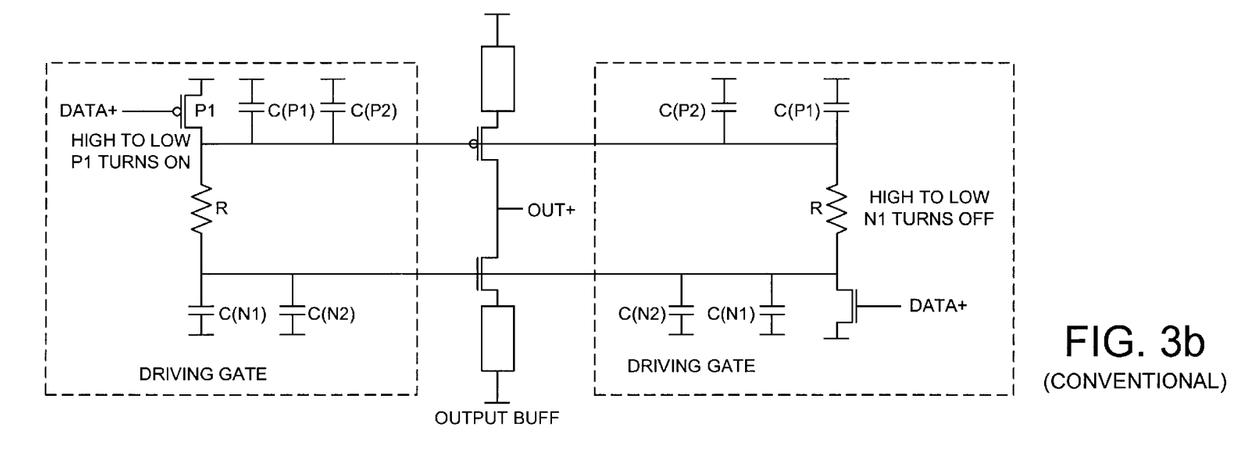

Referring to FIG. 3a, a circuit diagram of a second conventional output buffer 10' is shown. FIG. 3b illustrates resistive and capacitive loads of the circuit 10' of FIG. 3a. The elements in the PMOS driver path are matched through a variable resistive load (i.e., variable across process and corner variations) and associated variable load capacitances (i.e., variable since the voltage level is changing during the transition) to the variable load conditions of the NMOS driver. The turn on of one driver must be matched to the turn off of the complementary driver. In order to mach the turn on of one driver to the turn off of a complementary driver, the timing is generally altered. One conventional way to predictably alter the timing is to build a circuit with fundamentally different timing and then size the PMOS driver (i.e., 2× the value of the NMOS driver). However, for various corners and temperatures, the results of such an approach will not be consistent.

Figure 4A:
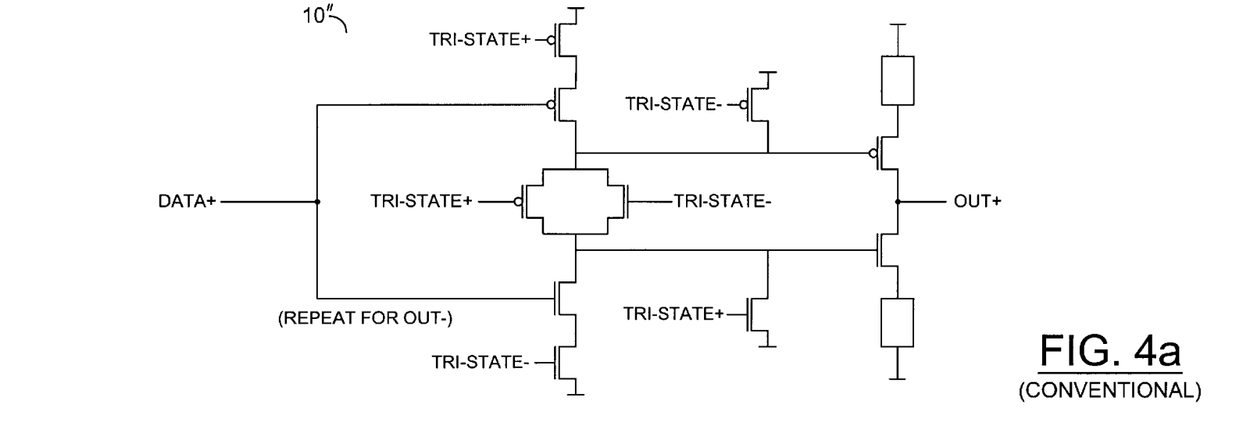
FIG. 4a is a circuit diagram of another conventional tristate output buffer.
Figure 4B:
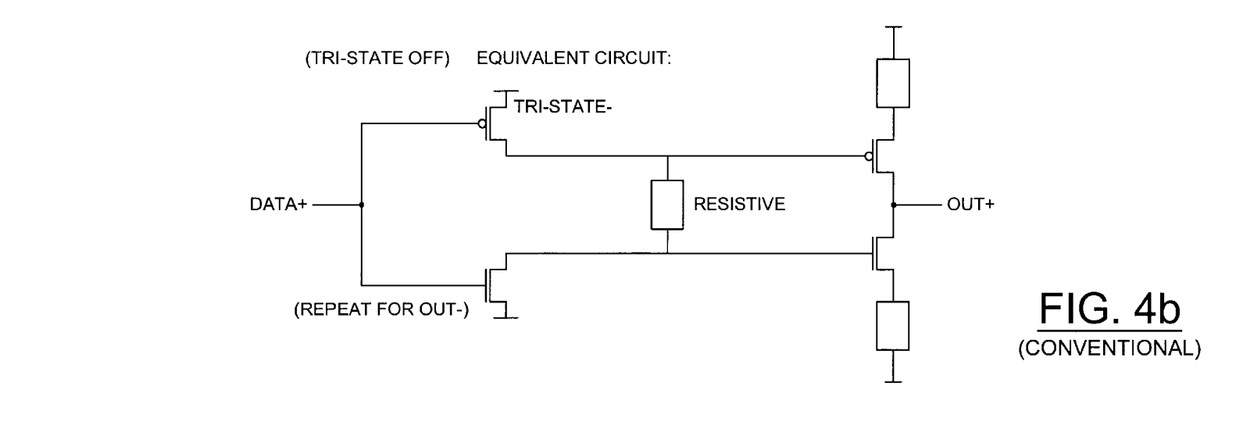
FIG. 4b is a circuit diagram illustrating the equivalent of FIG. 4a with tri-state off.

Referring to FIG. 4a, a circuit diagram of a third conventional tristate output buffer 10" is shown. FIG. 4b shows an equivalent of circuit 10" with tri-state off. The circuit 10" has similar disadvantages as the circuit 10'.

SUMMARY OF THE INVENTION

The present invention concerns a circuit comprising a first and a second circuit. The first circuit may be configured to generate a first control signal and a second control signal in response to (i) a first input signal and (ii) an enable signal. The first control signal generally matches the second control signal. The second circuit may be configured to generate a third control signal and a fourth control signal in response to (i) a second input signal and (ii) the enable signal. The third control signal generally matches the fourth control signal.

The objects, features and advantages of the present invention include providing a circuit, architecture, and method for implementing a tri-state output buffer with control signals matched to control the timing of the output transistors.

BRIEF DESCRIPTION OF THE DRAWINGS

These and other objects, features and advantages of the present invention will be apparent from the following detailed description and the appended claims and drawings in which:

FIG. 3b is a circuit diagram illustrating a disadvantage of the output buffer shown in FIG. 3a;

DETAILED DESCRIPTION OF THE PREFERRED EMBODIMENTS

Figure 5:
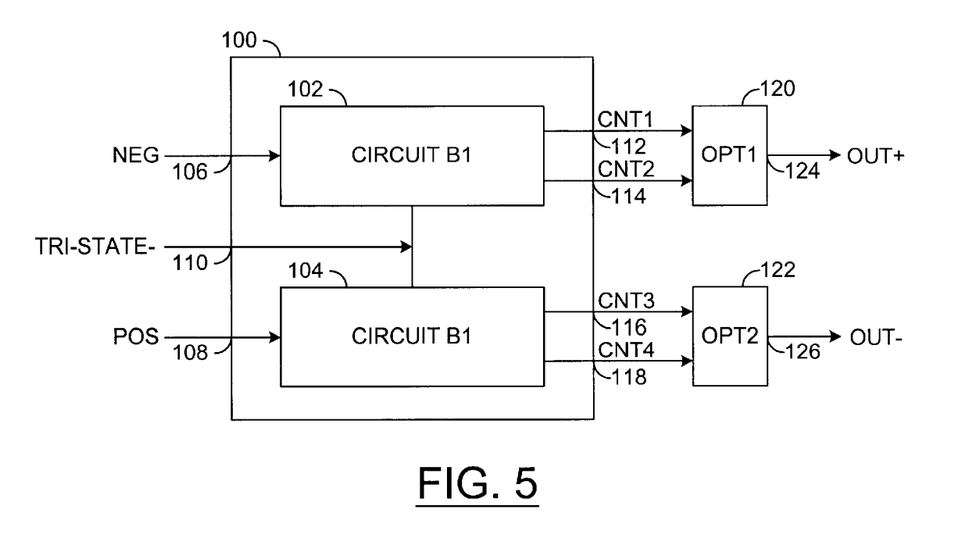
FIG. 5 is a block diagram illustrating a preferred embodiment of the present invention.

Referring to FIG. 5, a block diagram of a circuit 100 is shown in accordance with a preferred embodiment of the present invention. The circuit 100 generally comprises a circuit 102 and a circuit 104. The circuit 100 may have an input 106 that may receive a first input signal (e.g., NEG), an input 108 that may receive a second input signal (e.g., POS), and an input 110 that may receive a signal (e.g., an enable signal TRI-STATE-). The circuit 100 may have an output 112 that may generate a first control signal (e.g., CNT1) in response to the signals NEG and TRI-STATE-.

The circuit 100 may have an output 114 that may generate a second control signal (e.g., CNT2) in response to the signals NEG and TRI-STATE-. The circuit 100 may have an output 116 that may generate a third control signal (e.g., CNT3) in response to the signals POS and TRI-STATE-. The circuit 100 may have an output 118 that may generate a fourth control signal (e.g., CNT4) in response to the signals POS and TRI-STATE-.

The signals CNT1 and CNT2 may be matched signals. The signals CNT3 and CNT4 may be matched signals. In particular, only one of the signals CNT1 and CNT2 (or one of the signals CNT3 and CNT4) may be in the same state (e.g., an active, or digital "1" state) at a given time. For example, the signal CNT1 may be "on" (e.g., a digital HIGH, or 1) and the signal CNT2 may be "off" (e.g., a digital LOW, or 0). However, the particular polarities of the on (e.g., asserted) and off (e.g., de-asserted) states of the control signals CNT1 and CNT2 may be adjusted (e.g., reversed) accordingly to meet the design criteria of a particular implementation. Additionally, the polarities of the output transistors (to be described in more detail in connection with FIGS. 7–10) may be reversed, or otherwise altered (e.g., both the same) which may result in other polarity combinations of the control signals CNT1 and CNT2 (or CNT3 and CNT4).

The circuit 100 is shown connected to a circuit 120 and a circuit 122. In one example, the circuit 100, along with the circuits 120 and 122, may be a tri-state output buffer. The signals CNT1 and CNT2 may be presented to the circuit 120. The circuit 120 may have an output 124 that may generate a first output data signal (e.g., OUT+) in response to the signals CNT1 and CNT2. The circuit 122 may receive the signals CNT3 and CNT4. The circuit 122 may have an output 126 that may generate a second output data signal (e.g., OUT−) in response to the signals CNT3 and CNT4.

Figure 6:
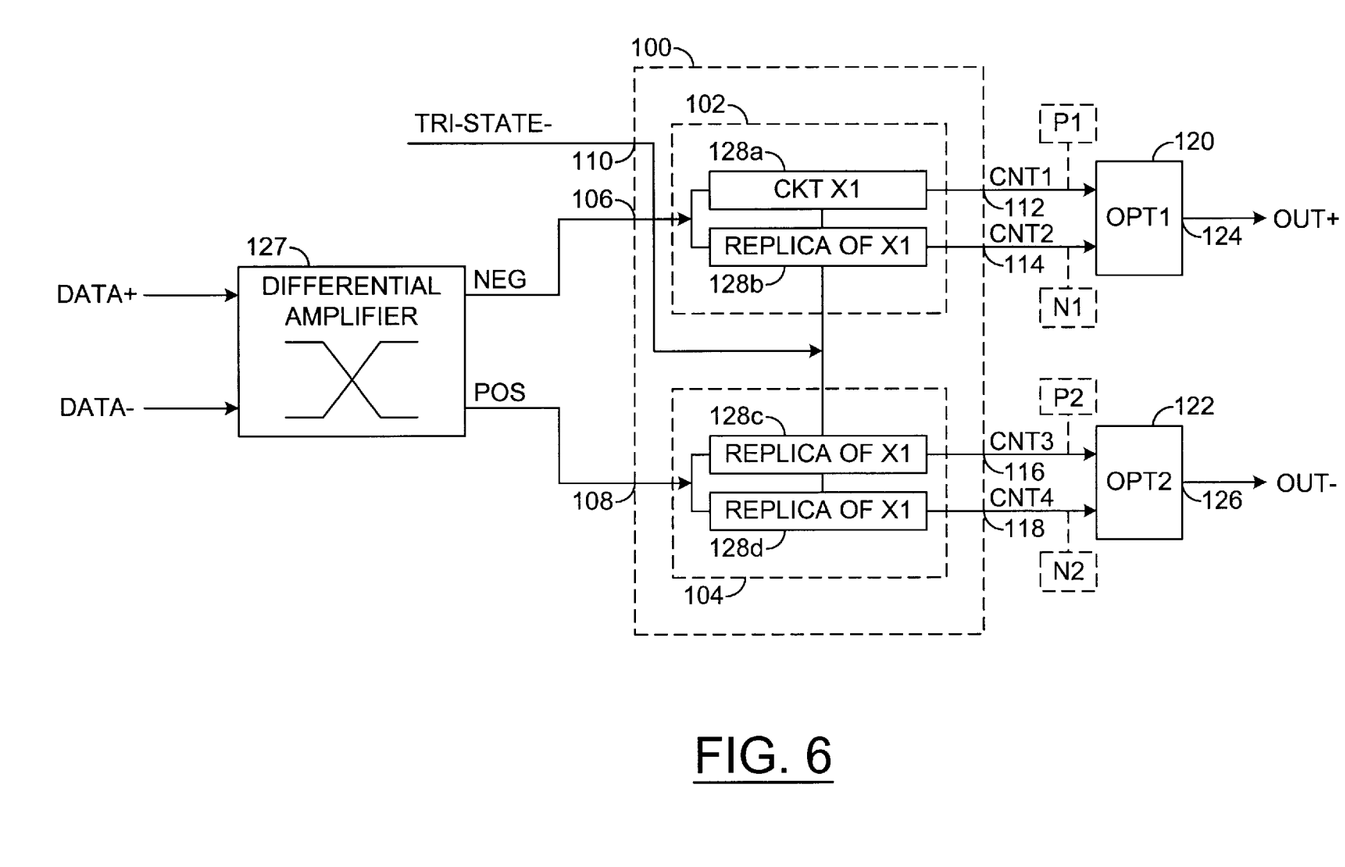
FIG. 6 is a more detailed block diagram of a preferred embodiment of the present invention.

Referring to FIG. 6, a more detailed block diagram of the circuit 100 is shown. The circuit 100 is generally shown connected to a circuit 127. In one example, the circuit 127 may be a differential amplifier. The circuit 127 may generate the signal NEG and the signal POS in response to a positive data signal (e.g., Data+) and a negative data signal (e.g., Data−). A device P1 may be connected between the output 112 and the circuit 120. A device N1 may be connected between the output 114 and the circuit 120. A device P2 may be connected between the output 116 and the circuit 122. A device N2 may be connected between the output and the circuit 122. The devices P1, N1, P2 and N2 may be implemented, in one example, as one or more MOSFET transistors. However, other types of transistors may be implemented accordingly to meet the design criteria of a particular application. In one example, the devices P1 and P2 may be P-type MOSFET transistors. In one example, the devices N1 and N2 may be N-type MOSFET transistors. The devices P1 and N1 and the devices P2 and N2 may ensure that the output transistors of the circuit 120 (or the circuit 122) are not on together (or are otherwise matched). In one example, devices P1, N1, P2, and N2 may be implemented externally. Alternately, the devices P1 and N1 may be incorporated into the circuit 102 and the devices P2 and N2 may be incorporated into the circuit 104.

The circuit 102 generally comprises a circuit 128(a) and a circuit 128(b). The circuit 128(a) may receive the signal NEG and the signal TRI-STATE−. The circuit 128(a) may generate the signal CNT1 in response to the signals NEG and TRI-STATE−. The circuit 128(b) may receive the signal NEG and the signal TRI-STATE−. The circuit 128(b) may generate the signal CNT2 in response to the signal NEG and the signal TRI-STATE−. The circuit 104 generally comprises a circuit 128(c) and a circuit 128(d). The circuit 104 and the circuit 102 may have a similar implementation. Therefore, the signals CNT3 and CNT4 may be generated by the circuit 104 similar to the generation of the signals CNT1 and CNT2 by the circuit 102.

Figure 7:
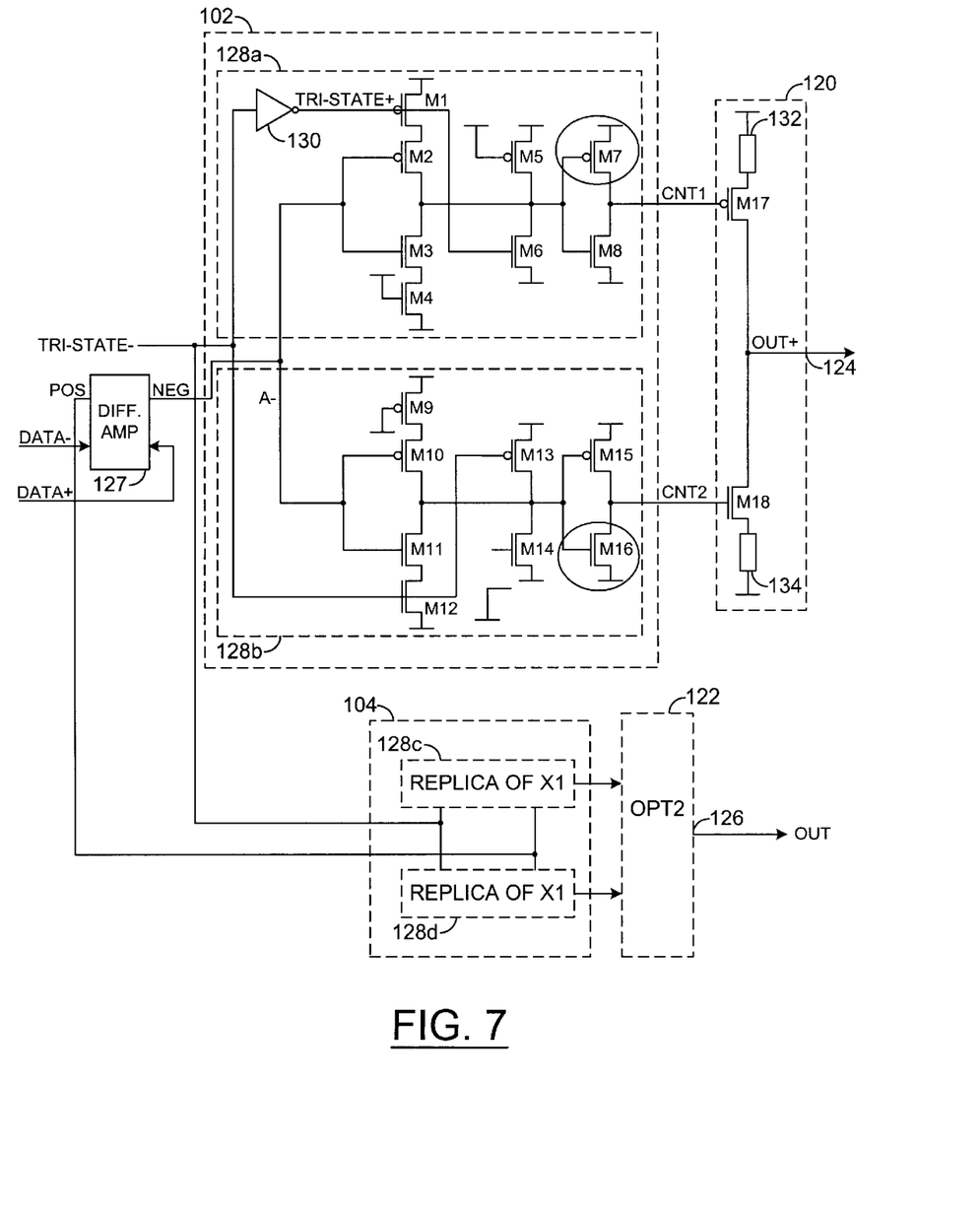
FIG. 7 is a circuit diagram of a preferred embodiment of the present invention.

Referring to FIG. 7, a circuit diagram illustrating components of the circuits 128(a), 128(b) and 120 is shown. The circuit 128(a) generally comprises an inverter 130 and eight transistors M1–M8. The circuit 128(a) may receive the signal NEG and the signal TRI-STATE−. The circuit 128(a) may generate the signal CNT1 in response to the signals NEG and TRI-STATE−. The transistors M1–M8 may be implemented, in one example, as one or more MOSFET transistors. However, other types of transistors may be implemented accordingly to meet the design criteria of a particular application. The transistors M1, M2, M5 and M7 may be implemented, in one example, as P-type transistors. The transistors M3, M4, M6 and M8 may be implemented, in one example, as N-type transistors. The inverter 130 may present the signal TRI-STATE+ in response to the signal TRI-STATE−. The signal TRI-STATE+ may be presented to a gate of the transistor M1 and to a gate of the transistor M6.

A source of the transistor M1 may be connected to a voltage source (e.g., VCC). A drain of the transistor M1 may be connected to a source of the transistor M2. The signal NEG may be presented to a gate of the transistors M2 and M3. A drain of the transistor M2 may be connected to a drain of the transistor M3, a drain of the transistor M5, a drain of the transistor M6 and a gate of the transistors M7 and M8. A source of the transistor M3 may be connected to a drain of the transistor M4. A gate of the transistor M4 may be connected to the voltage source VCC. A source of the transistor M4 may be connected to a ground potential (e.g., VSS). A source and a gate of the transistor M5 may be connected to the voltage source VCC. A drain of the transistor M6 may be connected to the ground potential VSS. A source of the transistor M7 may be connected to the voltage source VCC. A drain of the transistor M7 may be connected to a drain of the transistor M8. The signal CNT1 may be generated at a node formed by the drain of the transistor M7 and the drain of the transistor M8. A source of the transistor M8 may be connected to the ground potential VSS.

The circuit 128(b) may be configured to receive the signal NEG and the present to language signal TRI-STATE−. The circuit 128(b) may be configured to generate the signal CNT2 in response to the signals NEG and TRI-STATE−. The circuit 128(b) may comprise, in my example, eight transistors M9–M16. The transistors M9–M16 may be implemented, in one example, as one or more MOSFET transistors. However, other types of transistors may be implemented accordingly to meet the design criteria of a particular application. The transistors M9, M10, M13 and M15 may be, in one example, P-type transistors. The transistors M11, M12, M14 and M16 may be, in one example, N-type transistors. The transistors M9–M16 may be connected similarly to the transistors M1–M8. The signal CNT2 may be generated at a node formed by a drain of the transistor M15 and a drain of the transistor M16. The signal CNT2 may be matched to the signal CNT1. Once signal matching is achieved, the transistor M7 may also be sized greater than the transistor M15 and the transistor M16 may also be sized greater than the transistor M8 in order to further ensure that the output transistors will not be on together. However, in certain design criteria, such sizing may not be required.

The circuit 120 generally comprises a resistor 132, a transistor M17, a transistor M18 and a resistor 134. The circuit 120 may receive the signal CNT1 from the circuit 128(a) and the matched signal CNT2 from the circuit 128(b). The circuit 120 may be configured to generate the signal OUT+ in response to the signals CNT1 and CNT2. The transistors M17 and M18 may be implemented, in one example, as one or more MOSFET transistors. However, other types of transistors may be implemented accordingly to meet the design criteria of a particular application. The transistor M17 may be a P-type MOSFET transistor. The transistor M18 may be a N-type MOSFET transistor. A source of the transistor M17 may be connected to the voltage source VCC through the resistor 132. The signal CNT1 may be presented to a gate of the transistor M17. A drain of the transistor M17 may be connected to a drain of the transistor M18. The signal OUT+ may be generated at a node formed by the drain of the transistor M17 and the drain of the transistor M18. A source of the transistor M18 may be connected to the ground potential VSS through the resistor 134.

Figure 8:
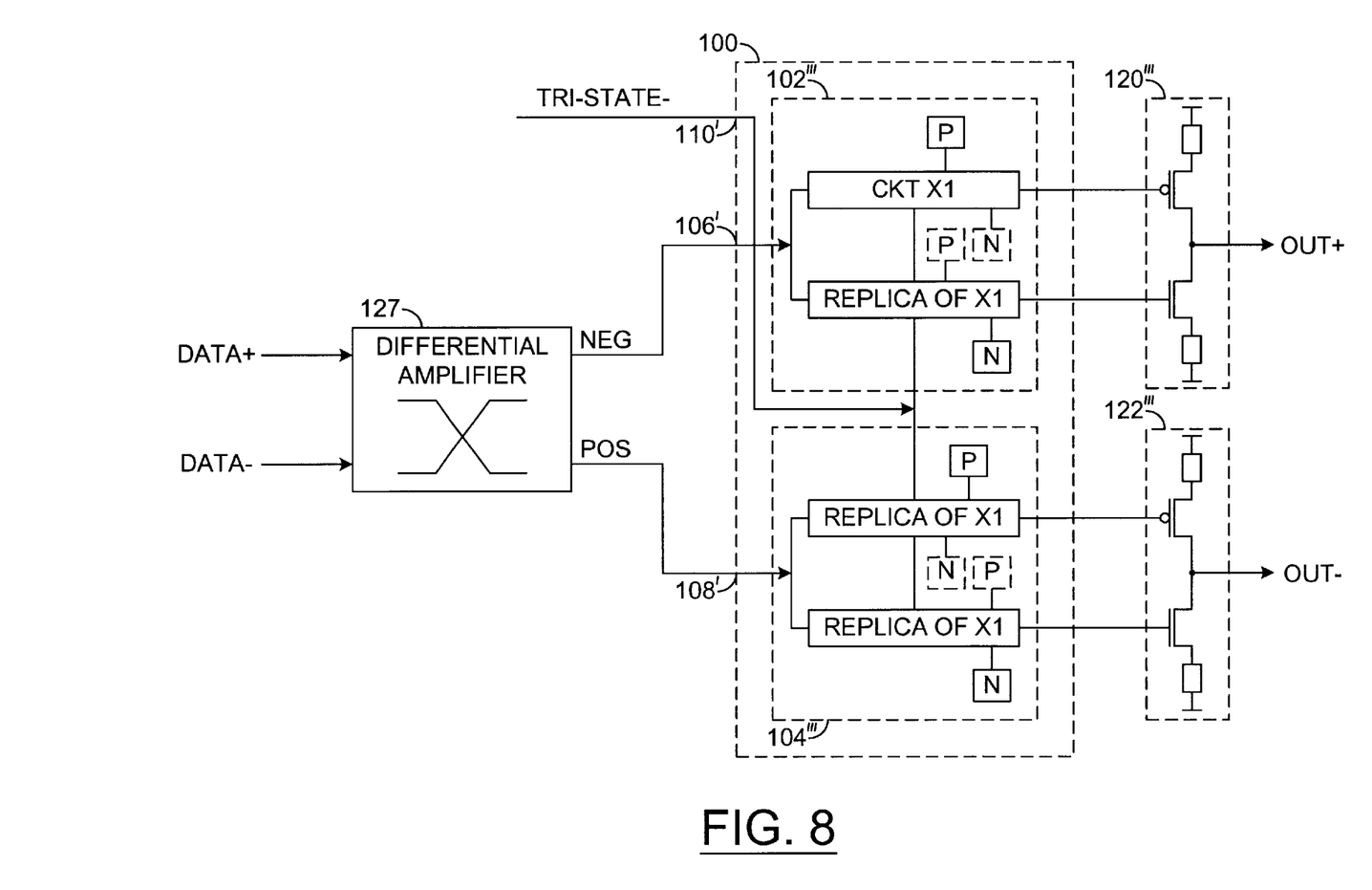
FIG. 8 is an architectural representation of an alternate embodiment of the present invention.

Referring to FIG. 8, an architectural representation of a circuit 100''' is shown. The circuit 100''' may be configured to ensure that the output transistors do not turn on at the same time by implementing speed compensation matching. The PMOS and NMOS transistor speed compensating structure that may ensure that the output transistors are not on together are indicated by solid boxes marked P and N, respectively. The PMOS and NMOS dummy structures used to match the loading of the speed compensating transistors are indicated by dotted boxes marked P and N, respectively.

Figure 9:
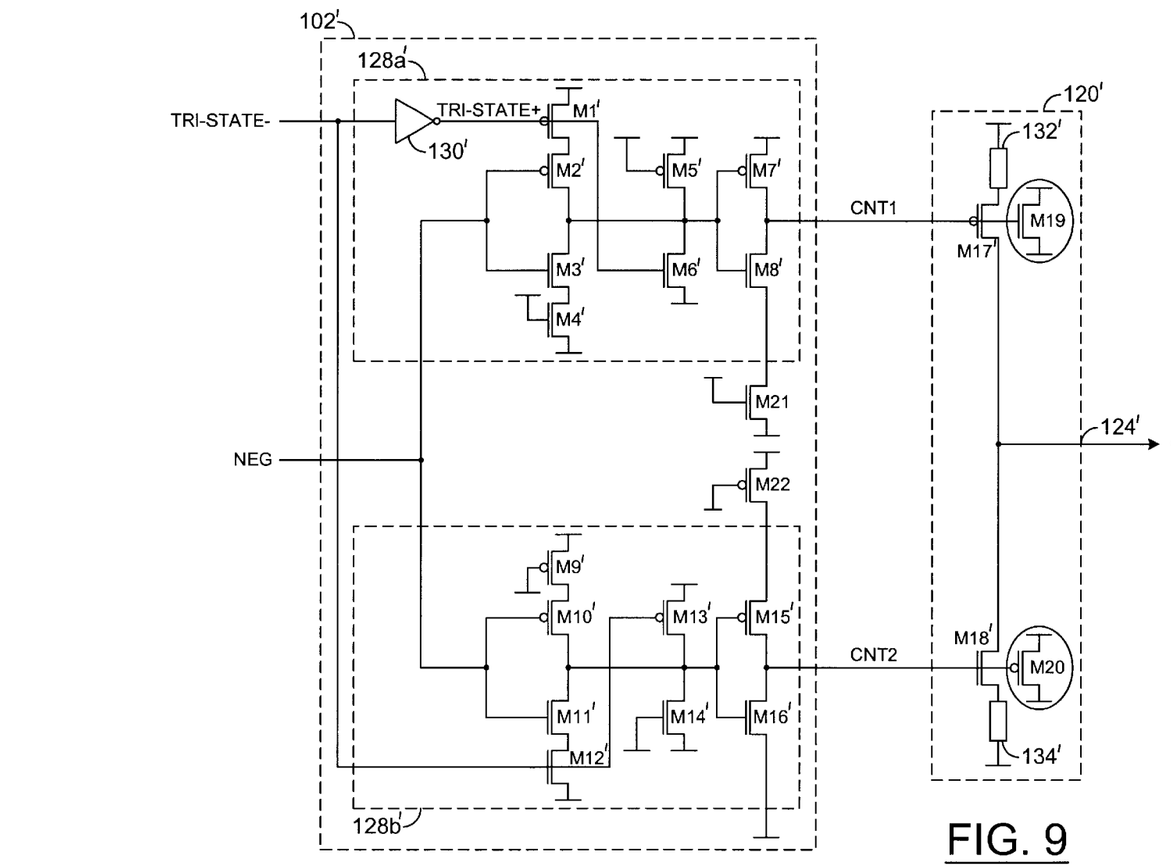
FIG. 9 is a circuit diagram of an alternate embodiment of the present invention.

Referring to FIG. 9, a circuit 102' illustrating an alternate construction is shown. The circuit 102' may ensure that a set of output transistors M17 and M18 do not turn on at the same time by matching output loads. The circuit 102' generally comprises a circuit 128(a)', a circuit 128(b)', a transistor M21 and a transistor M22. The transistors M21 and M22 may be implemented, in one example, as one or more MOSFET transistors. The transistor M21 may be an N-type MOSFET transistor. The transistor M22 may be a P-type MOSFET transistor. However, other types of transistors may be implemented to meet the design criteria of a particular application. The circuit 102' is generally shown connected to a circuit 120'. The circuit 102' may be similar to the circuit 102 illustrated in FIG. 5. The circuit 128(a)' may be similar to the circuit 128(a). However, the source of the transistor M8' may be connected to the drain of the transistor M21. The gate of the transistor M21 may be connected to VCC and the source of the transistor M21 may be connected to ground. The circuit 128(b)' may be similar to the circuit 128(b). However, the source of the transistor M15' may be connected to the drain of the transistor M22. The gate of the transistor M22 may be connected to ground and the source of the transistor M22 may be connected to vcc.

The circuit 120' may operate similarly to the circuit 120, (e.g., generating the signal OUT+ in response to the signals CNT1 and CNT2). The circuit 120' may be similar to the circuit 120. In order to match the output load, two more transistors (e.g., the transistors M19 and M20) may be implemented. The transistor M19 may be an N-type MOSFET transistor. The transistor M20 may be a P-type MOSFET transistor. The transistors M19 and M20 may be implemented, in one example, as one or more MOSFET transistors. However, other types of transistors may be implemented to meet the design criteria of a particular application. The signal CNT1 may be presented to a gate of the transistor M19. A drain of the transistor M19 may be connected to VCC. A source of the transistor M19 may be connected to VSS. The signal CNT2 may be presented to a gate of the transistor M20. A drain of the transistor M20 may be connected to VSS. A source of the transistor M20 may be connected to VCC. The circuits 120' and 122' may be similar. The signal OUT– may be generated by the circuit 122' similar to the way the signal OUT+ may be generated by the circuit 120'.

Figure 10:
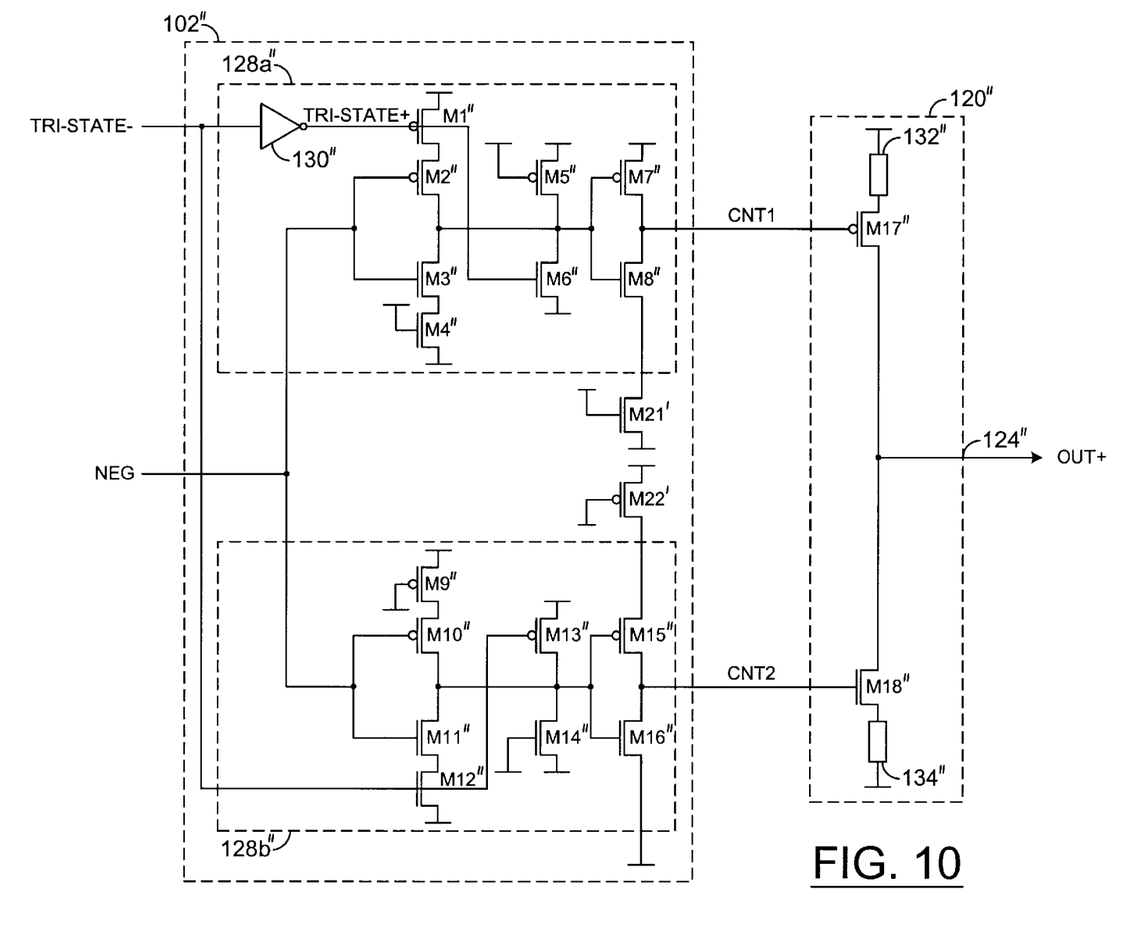
FIG. 10 is a circuit diagram of another alternate embodiment of the present invention.

Referring to FIG. 10, a diagram of a circuit 102'' illustrating an alternate implementation is shown. The circuit 100'' may ensure that a set of output transistors do not turn on at the same time by implementing matched blocks with signal altering transistors. The circuit 100'' generally comprises a circuit 102'' and a circuit 104''. The circuit 100'' is generally shown connected to a circuit 120''. The block diagram of the circuit 100'' is similar to the block diagram of the circuit 100 illustrated in FIG. 5. The circuit 102'' generally comprises a circuit 128(a)'', a circuit 128(b)'', a transistor M21' and a transistor M22'.

The circuit 128 (a)' may be similar to the circuit 128(a)'. The circuit 128(b)'' may be similar to the circuit 128 (b)'. The circuit 120'' may be similar to the circuit 120.

The circuit 120'' behaves similarly to the circuit 120, generating the signal OUT+ in response to the signals CNT1 and CNT2. The circuits 102'' and 104'' may be similar. Therefore, the signal OUT– may be generated by the circuit 122'' similar to the way the signal OUT+ is generated by the circuit 120''.

While the invention has been particularly shown and described with reference to the preferred embodiments thereof, it will be understood by those skilled in the art that various changes in form and details may be made without departing from the spirit and scope of the invention.

What is claimed is:

1. A circuit comprising:
    a first circuit comprising a first timing compensation device, configured to generate a first control signal and a second control signal in response to (i) a first input signal and (ii) an enable signal, wherein said first control signal matches said second control signal;
    a second circuit configured to generate a third control signal and a fourth control signal in response to (i) a second input signal and (ii) said enable signal, wherein said third control signal matches said fourth control signal;
    a first output driver circuit comprising a first PMOS output transistor and a first NMOS output transistor configured to generate a first output signal in response to said first and second control signals, wherein turn on/off timing of said first PMOS output transistor and said first NMOS output transistor are altered in response to said first timing compensation device; and
    a second output driver circuit comprising a second PMOS output transistor and a second NMOS output transistor configured to generate a second output signal in response to said third and fourth control signals.

2. The circuit according to claim 1, wherein said enable signal comprises a tri-state control signal.

3. The circuit according to claim 1, wherein:
    said first input signal and said second input signal comprise a differential input signal.

4. The circuit according to claim 1, wherein said first circuit comprises a second timing compensation device configured to alter turn on/off timing of said first PMOS and said first NMOS output transistors in addition to the match of said first and second control signals.

5. The circuit according to claim 4, wherein said second circuit comprises a third timing compensation device configured to alter turn on/off timing of said second PMOS and said second NMOS output transistors in addition to the match of the third and fourth control signals.

6. The circuit according to claim 5, wherein said second circuit comprises a fourth timing compensation device configured to alter turn on/off timing of said second PMOS and said second NMOS output transistors in addition to the match of the third and fourth control signals.

7. The circuit according to claim 1, wherein:
    said first control signal is configured to regulate a first pull down transistor;
    said second control signal is configured to regulate a first pull up transistor;
    said third control signal is configured to regulate a second pull down transistor; and
    said fourth control signal is configured to regulate a second pull up transistor.

8. The circuit according to claim 1, wherein said circuit comprises a tri-state output buffer.

9. A circuit comprising:

means comprising a first timing compensation device for generating a first control signal and a second control signal in response to (i) a first input signal and (ii) an enable signal, wherein said first control signal matches said second control signal;

means for generating a third control signal and a fourth control signal in response to (i) a second input signal and (ii) said enable signal, wherein said third control signal matches said fourth control signal;

first output driver means comprising a first PMOS output transistor and a first NMOS output transistor for generating a first output signal in response to said first and second control signals, wherein turn on/off timing of said first PMOS output transistor and said first NMOS output transistor are altered in response to said first timing compensation device; and second output driver means comprising a second PMOS output transistor and a second NMOS output transistor for generating a second output signal in response to said third and fourth control signals.

10. A method for creating a tri-state output buffer with matched signals to a first set of PMOS and NMOS output transistors and a second set of PMOS and NMOS output transistors comprising the steps of:

generating a first control signal and a second control signal in response to (i) a first input signal and (ii) an enable signal, wherein said first control signal matches said second control signal;

generating a third control signal and a fourth control signal in response to (i) a second input signal and (ii) said enable signal, wherein said third control signal matches said fourth control signal; and generating a first output signal using a first output driver circuit comprising a first PMOS output transistor and a first NMOS output transistor in response to said first and second control signals, wherein turn on/off timing of said first PMOS output transistor and said first NMOS output transistor are altered in response to said first timing compensation device; and generating a second output signal using a second output driver circuit comprising a second PMOS output transistor and a second NMOS output transistor in response to said third and fourth control signals.

11. The method according to claim 10, wherein said first control signal is presented to said PMOS output transistor and said second control signal is presented to said NMOS output transistor.

12. The method according to claim 11, wherein said first control signal regulates timing of said first and second PMOS output transistors.

13. The method according to claim 12, wherein said second control signal regulates timing of said first and second NMOS output transistors.

14. The method according to claim 10, wherein said first control signal is presented to said first and second PMOS output transistors and said second control signal is presented to said first and second NMOS output transistors.

15. The method according to claim 12, wherein said third control signal regulates timing of said PMOS output transistor.

16. The method according to claim 12, wherein said fourth control signal regulates timing of said NMOS output transistor.

* * * * *